(12) United States Patent
Li et al.

(10) Patent No.: US 8,884,802 B2
(45) Date of Patent: Nov. 11, 2014

(54) SYSTEM, METHOD AND RECORDING MEDIUM FOR ANALOG TO DIGITAL CONVERTER CALIBRATION

(71) Applicant: Analog Devices Technology, Hamilton (BM)

(72) Inventors: Zhao Li, Vaughn (CA); Shipra Bhal, Norwood, MA (US); Kevin Glenn Gard, Raleigh, NC (US); David Alldred, Toronto (CA); Christopher Mayer, Dover, MA (US); Trevor Clifford Caldwell, Toronto (CA); David J. McLaurin, Durham, NC (US); Victor Kozlov, Toronto (CA)

(73) Assignee: Analog Devices Technology, Hamilton (BM)

( * ) Notice: Subject to any disclaimer, the term of this patent is extended or adjusted under 35 U.S.C. 154(b) by 0 days.

(21) Appl. No.: 13/920,083

(22) Filed: Jun. 18, 2013

(65) Prior Publication Data

US 2014/0266825 A1 Sep. 18, 2014

Related U.S. Application Data

(60) Provisional application No. 61/789,939, filed on Mar. 15, 2013.

(51) Int. Cl.
*H03M 1/34* (2006.01)
*H03M 1/10* (2006.01)
*H03M 1/00* (2006.01)
*H03M 1/12* (2006.01)

(52) U.S. Cl.
CPC .............. *H03M 1/1009* (2013.01); *H03M 1/00* (2013.01); *H03M 1/12* (2013.01)
USPC ............................................ 341/158; 341/155

(58) Field of Classification Search
CPC .................................. H03M 1/00; H03M 1/12
USPC ....................... 341/158, 155, 156, 120; 31/118
See application file for complete search history.

(56) References Cited

U.S. PATENT DOCUMENTS

| | | |
|---|---|---|
| 5,063,383 A | 11/1991 | Bobba |
| 7,420,494 B1 | 9/2008 | Schreier |
| 7,576,671 B2 * | 8/2009 | Petilli et al. .................. 341/143 |
| 7,728,753 B2 | 6/2010 | Taft et al. |
| 8,378,869 B2 | 2/2013 | Chae et al. |
| 2010/0002747 A1 | 1/2010 | Bosch et al. |

* cited by examiner

*Primary Examiner* — Joseph Lauture
(74) *Attorney, Agent, or Firm* — Patent Capital Group

(57) ABSTRACT

A calibration system for an analog-to-digital converter (ADC) an internal ADC that receives an analog input and converts the analog input to digital multi-bit data. The calibration system also includes a reference shuffling circuit that shuffles reference values of comparators of the internal ADC. Further, the calibration system includes a calibration circuit that calibrates the comparators of the internal ADC. The calibration system includes a digital block that measures an amplitude based on the digital multi-bit data. Additionally, the calibration system includes calibration logic that controls the calibration circuit based on an output of the digital block.

20 Claims, 4 Drawing Sheets

SYSTEM, METHOD AND RECORDING MEDIUM FOR ANALOG TO DIGITAL CONVERTER CALIBRATION

CROSS-REFERENCE TO RELATED APPLICATION

This application claims the benefit of priority under 35 U.S.C. §119(e) to U.S. Provisional Application Ser. No. 61/789,939, "ANALOG TO DIGITAL CONVERTER (ADC) FLASH CALIBRATION" filed Mar. 15, 2013, which is hereby incorporated by reference in its entirety.

TECHNICAL FIELD

This disclosure relates in general to the field of analog-to-digital converters (ADCs) and, more particularly, to correct for comparator non-idealities in an ADC.

BACKGROUND OF THE DISCLOSURE

A flash ADC includes a series of comparators to compare an analog input voltage to a series of reference voltages. The output of the ADC corresponds to the reference voltage closest to, but not exceeding, the input voltage. However, manufacturing imperfections, such as offsets, can cause a comparator to effectively compare the analog input voltage to a different value than the nominal reference voltage associated with that comparator. Accordingly, correction is applied to the comparators to compensate for these imperfections.

Previously, efforts were made to provide offset correction in a $\Delta\Sigma$ ADC including a loop filter connected to an internal flash ADC. In this effort, blocks of the ADC were taken offline, and a DC-calibration scheme was performed. Specifically, the comparators in the ADC were first disconnected from the loop filter. Then, a static input (generally, common-mode) was applied both to the input and as the reference voltage of a comparator. Calibration codes of the comparator were swept from the lowest values to the highest values until the output of the comparator toggled. The code toggling the output of the comparator indicated an estimate of that comparator's offset. The procedure was then repeated for every comparator in the flash ADC. The comparators were reconnected to the loop filter, using the indicated calibration trim codes, for normal operation.

OVERVIEW

An oversampling ratio (OSR) is generally designed to be greater than 10 in a $\Delta\Sigma$ ADC so that thermal noise dominates over quantization noise from back-end flash comparators. Thus, quantization noise from the backend flash ADC is a significant portion of the noise budget. Notably, it is possible for the quantization noise to be near the same level as thermal noise. In this case, simulations have shown that, without calibrating the flash ADC, the majority of $\Delta\Sigma$ ADCs would fail to meet noise specifications. Quantization noise itself is process-dependent due to comparator offsets in the flash ADC and is set by the resolution of the flash ADC.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF EXAMPLE EMBODIMENTS

Overview

A calibration system for a $\Delta\Sigma$ (Delta-Sigma) analog-to-digital converter (ADC) is provided in one example and includes an internal ADC that receives an analog input and converts the analog input to digital multi-bit data; a reference shuffling circuit that shuffles reference values of comparators of the internal ADC; a calibration circuit that calibrates the comparators of the internal ADC; a digital block that measures an amplitude based on the digital multi-bit data; and calibration logic configured to control the calibration circuit based on an output of the digital block.

In one implementation, a reference shuffling scheme is implemented in schemes that ensure that one or more of the comparators experience transitions over time, and the schemes include one of a data weighted average (DWA) scheme, a leap-frogging scheme, and a swapping scheme. In another implementation, the calibration circuit adjusts offsets of the comparators of the internal ADC. Further, the digital block can be implemented in conjunction with a power meter that can estimate an output power by one of calculating a sum-of-absolute and calculating a sum-of-squares. Additionally, the calibration logic can be implemented on an embedded programmable microprocessor. In addition, the calibration logic can be implemented as an on-chip architecture involving custom logic. Further, the calibration logic can be implemented with one of a random walk algorithm, a simulated annealing algorithm, and a genetic algorithm.

In another example, a calibration system for a $\Delta\Sigma$ (Delta-Sigma) analog-to-digital converter (ADC) is provided and includes an internal ADC that receives an analog input and converts the analog input to digital multi-bit data; a digital block that measures an amplitude based on the digital multi-bit data; and calibration logic configured to control a calibration circuit of the internal ADC, based on an output of the digital block. The internal ADC also receives a training signal where the statistics of the signal are known a priori and cause states of the internal ADC to experience transitions over time. In one implementation, the training signal is a sinusoidal waveform with large power relative to the $\Delta\Sigma$ ADC full-scale. In another implementation, the training signal is random noise with large power relative to the $\Delta\Sigma$ ADC full-scale.

EXAMPLE EMBODIMENTS

Figure 1:
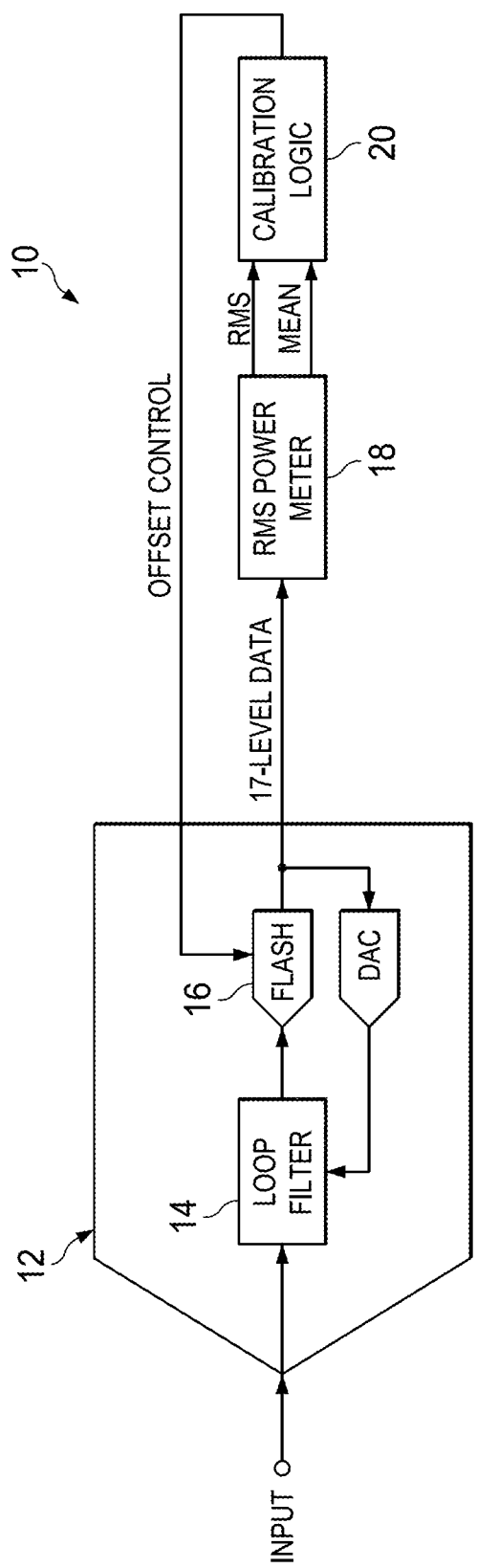
FIG. 1 is a simplified block diagram illustrating a system for a flash calibration technique in accordance with one embodiment of the present disclosure.

FIG. 1 is a simplified block diagram illustrating a system 10 for a flash calibration technique in accordance with one embodiment of the present disclosure. The system 10 includes a ΔΣ ADC 12, a root mean square (RMS) power meter 18, and calibration logic 20. The ΔΣ ADC 12 outputs 17-level digital data to the RMS power meter 18. In one embodiment, the RMS power meter 18 outputs both an RMS value and a mean value to the calibration logic 20.

The ΔΣ ADC 12 includes a loop filter 14 and a flash ADC 16. The 17-level digital data is fed back internally from the flash ADC 16 to the loop filter 14. In addition, the flash ADC 16 receives offset control values fed back from the calibration logic 20.

Figure 2:
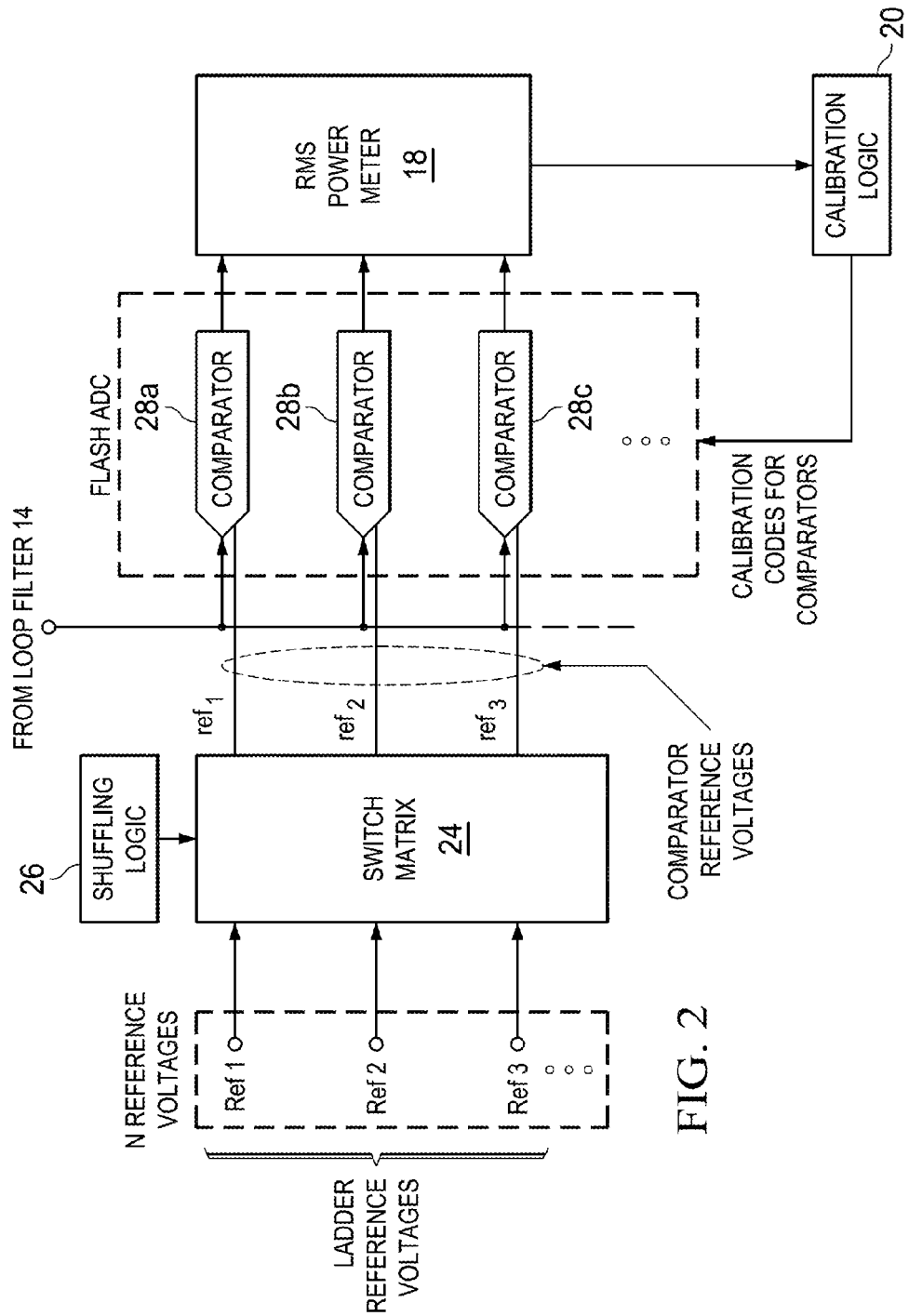
FIG. 2 is a simplified block diagram illustrating a flash ADC in accordance with one embodiment of the present disclosure.

FIG. 2 is a simplified block diagram illustrating the flash ADC 16 in accordance with one embodiment of the present disclosure. The flash ADC 16 includes a switch matrix 24, shuffling logic 26, and comparators 28a-28c. The flash ADC 16 has N+1 output levels, where N represents the number of comparators. In the embodiment discussed above, the ADC has 17 output levels, and there are 16 comparators. The flash ADC 16 outputs to the RMS power meter 18 digital values corresponding to an analog input to the flash ADC 16. The flash ADC 16 receives from the calibration logic 20 digital calibration codes that drive analog circuits within the comparators 28a-28c that adjust offsets of those comparators.

In a typical flash ADC, the reference voltages are connected directly to the comparators. Thus, when no analog input is applied to $V_{IN}$, the input to the flash ADC 16 is a very small, time-varying noise-like signal that causes the same few comparator outputs to transition over time. Only those comparators transition, due to insufficient variance to cause comparators with a very high or low reference to change their outputs.

Accordingly, in the flash ADC 16, the switch matrix 24 shuffles the connections to the reference voltages such that each comparator 28a-28c will eventually see a different reference voltage. For example, if the switch matrix 24 initially applies Ref 1 to comparator 28a, Ref 2 to comparator 28b, and Ref 3 to comparator 28c, then the switch matrix will later apply Ref 1 to comparator 28b, Ref 2 to comparator 28c, and Ref 3 to comparator 28a. In one embodiment of a ΔΣ ADC, the switch matrix 24 in the flash ADC 16 shuffles the connections to the reference voltages in a partially random fashion during every clock cycle.

Thus, the flash reference shuffling scheme ensures that every comparator experiences transitions over time, even if the input to the flash ADC is a very small, time-varying signal. Through those transitions, the comparators 28a-28c can be calibrated without the application of a training signal to the input of the ΔΣ ADC 12. Other schemes that ensure that one or more comparators experience transitions over time include a data weighted average (DWA) scheme, a leap-frogging scheme, a swapping scheme, and random selection.

In one embodiment, the calibration logic 20 is implemented in a programmable microprocessor. In another embodiment, the calibration logic 20 is implemented as an on-chip architecture involving custom logic. In a further embodiment, the calibration logic 20 is implemented as an off-chip architecture. The calibration logic is an example of a processing means. The calibration logic 20 interfaces with the calibration hardware of the flash ADC 16 and the RMS meter 18 via a digital communication interface.

Figure 3:
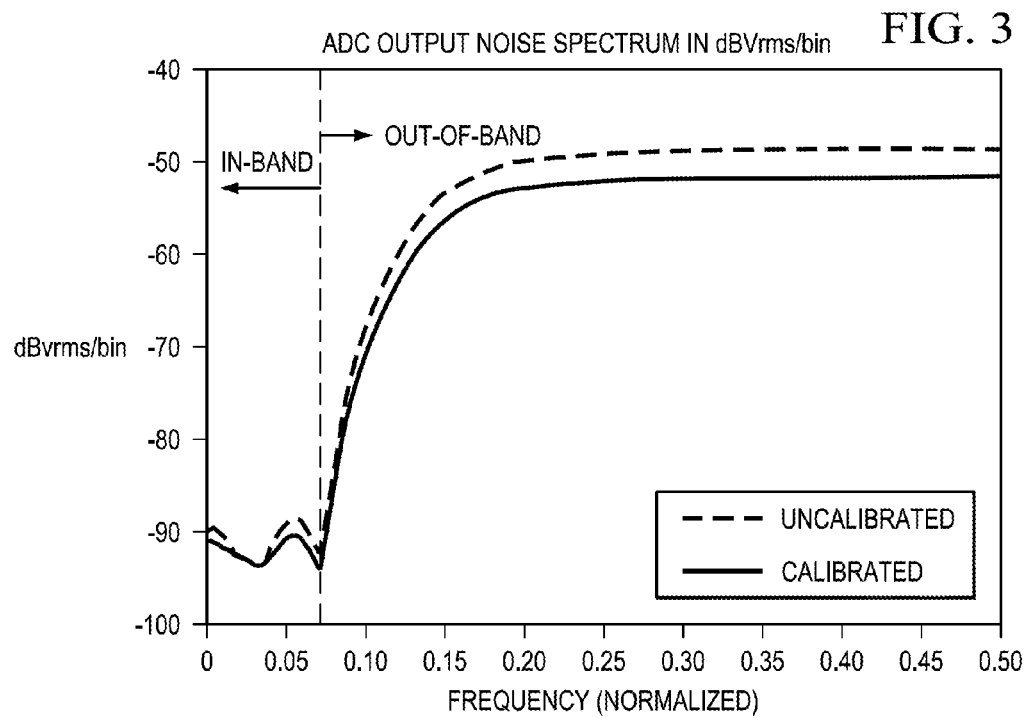
FIG. 3 illustrates a fast Fourier transform (FFT) spectrum of an uncalibrated ADC and a calibrated ADC in accordance with one embodiment of the present disclosure.

The output of the loop filter 14 contains the input signal and noise that is intrinsic to the system. Thus, to decouple the input signal's characteristics from measurements, the input of the loop filter 14 is disconnected. In this scheme, the input to the flash ADC 16 is a small fraction of the full-scale signal as it consists of only thermal noise and quantization noise. Then, an FFT of the output of the ΔΣ converter 12 is taken and the power of the in-band bins is found. Since the offsets of the comparators introduce white noise, in-band noise caused by the offsets can be optimized by minimizing the power of the entire FFT spectrum from 0 to fs/2, as illustrated in FIG. 3. FIG. 3 illustrates a fast Fourier transform (FFT) spectrum of an uncalibrated ADC and a calibrated ADC. With Parseval's theorem, the power of the entire FFT spectrum can be calculated with a time-domain RMS power meter. The RMS meter 18 in FIG. 1 thus generates the RMS and mean of the flash ADC 16 output. The mean output gives the option of removing the DC component from the RMS in the calibration logic by $$E(x-u)^2 = E(x^2) - 2uE(x) + u^2 = E(x^2) - u^2$$

where E( ) is the expectation operation and u is the mean of x.

Figure 4:
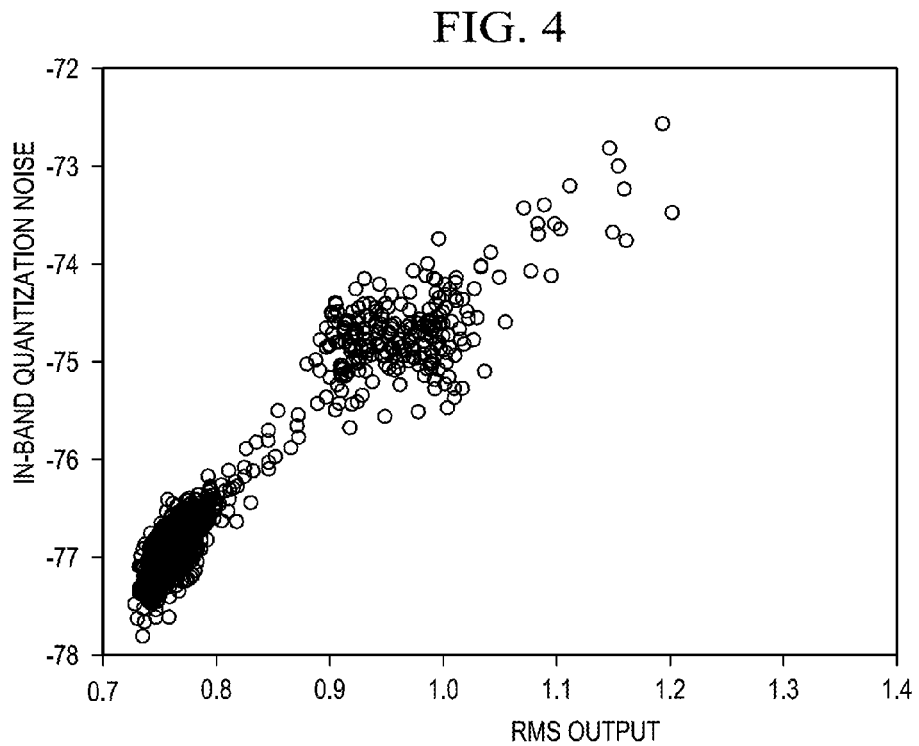
FIG. 4 is a graph illustrating RMS output against in-band quantization noise of an ADC in accordance with one embodiment of the present disclosure.

The calibration logic 20 adjusts the calibration codes so that the RMS output (with or without the DC component) of the ADC 16 is minimized. FIG. 4 is a graph illustrating RMS output against in-band quantization noise of an ADC. FIG. 4 shows the simulated correlation between ADC 16 RMS output and in-band quantization noise. The simulation included models for comparator offsets, reference shuffling, and thermal noise.

RMS meter 18 should take a large number of samples. A large number of samples are used so that the variance inherent in the noise does not impact measurement accuracy. In one embodiment, the RMS meter 18 accumulates both the square of the digital ADC sample values for each channel of the ADC, and also the sum of the (unsquared) digital ADC values.

$$SumSquare = \sum_{i=1}^{2^N} Rx[i]^2, \quad Sum = \sum_{i=1}^{2^N} Rx[i]$$

The actual RMS value can be computed at the end of an accumulation sequence with:

$$RMS = \sqrt{\frac{SumSquare}{2^N}}$$

$$RMS_{NoDC} = \sqrt{\frac{SumSquare}{2^N} - \left(\frac{Sum}{2^N}\right)^2}$$

Figure 5:
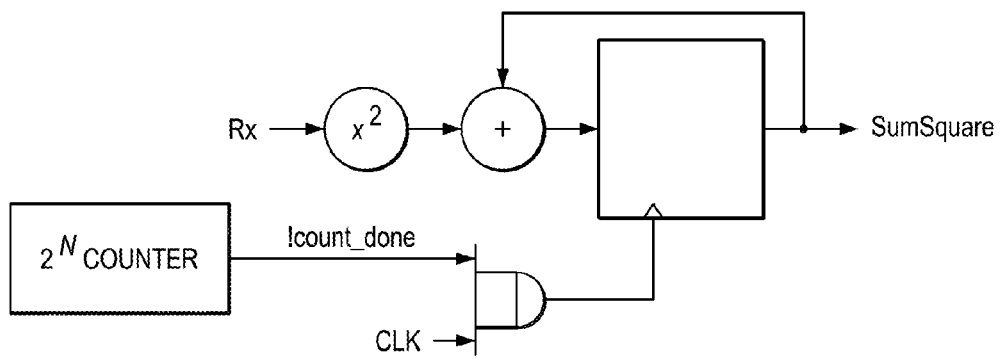
FIG. 5 is a simplified block diagram illustrating a sum-of-squared implementation of an RMS meter in accordance with one embodiment of the present disclosure.

Since the algorithm seeks a minimum RMS value, it is sufficient to only perform the accumulation and search for the lowest sum of squares rather than actually computing the RMS values. FIG. 5 is a simplified block diagram illustrating a sum of squares portion of the RMS meter 18.

FIG. 5 shows a circuit in which a value Rx is squared and then added to squares of previous values of Rx. This sum is then sampled by a register which is controlled by logic including clock CLK and signal Icount_done. The register enable signal is controlled by a portion beginning with a counter that counts from 1 to $2^N$. The counter outputs a variable Icount_done to an AND gate. The AND gate also receives a clock input CLK. The variable Icount_done is set when the counter has not counted to $2^N$. This causes the AND gate to pass the clock CLK to the register. This is the default behavior where the register samples the sum of the current sample of $Rx^2$ with the previous register output on every rising-edge of the clock CLK. The variable Icount_done is cleared when the counter has counted to $2^n$. Thus, enable signal is cleared, the AND gate disables the triggering of the register updates, and the sum will no longer be sampled onto the register. At that time, the accumulated value SumSquare becomes the valid output of the RMS meter 18.

In addition to calculating a sum-of-squares, in other embodiments, the RMS meter 18 can also calculate a sum-of-absolute and sub-sample the output of the flash ADC 16.

With access to the Sum-of-Squares and Sum outputs from the RMS meter 18, the calibration logic 20 can calculate the RMS output of the ADC 16, with and without the DC component. Implementing the calibration algorithm on the calibration logic 20 enables flexibility in loading different algorithms based on the setup. For example, an algorithm optimized for calibration time can be used during testing and another optimized for consistency can be used during start-up in the field.

The optimization algorithm in the calibration logic 20 significantly reduces the search space by only adjusting the codes orthogonally. That is, the calibration code for one comparator is adjusted with the codes for the other comparators fixed. This scheme assumes that the offset of each comparator is uncorrelated, which is true if a random flash reference shuffling scheme is used. However, the flash reference shuffling scheme in this example ADC is only partially random so it is possible for the algorithm to be stuck in a local minimum. To get around this problem, the calibration logic 20 periodically perturbs all the calibration codes and randomly chooses the order in which the comparators 28 are calibrated. The calibration logic performs perturbation by moving all the positive calibration codes in one direction and the negative calibration codes in the other by a set amount and is limited by the maximum and minimum calibration code range. Comparators with a zero calibration have their codes randomly moved in a direction.

Offsets in the flash comparators of the ADC 16 degrade the noise and linearity of the ADC. Every comparator in the ADC 16 has a finite number of calibration codes that can be used to steer the offsets to zero. This calibration scheme attempts to find the correct calibration codes for all the comparators with an optimization algorithm. An exhaustive search of all possible calibration codes is problematic due to the exponential nature of the search space: there are $X^Y$ combinations, where X is the number of calibration levels and Y is the number of comparators. An optimization algorithm should be used to reduce the search space. As detailed below, exemplary optimization algorithms include a random walk algorithm, a simulated annealing algorithm, and a genetic algorithm. The criterion of optimization is the ADC noise.

Figure 6:
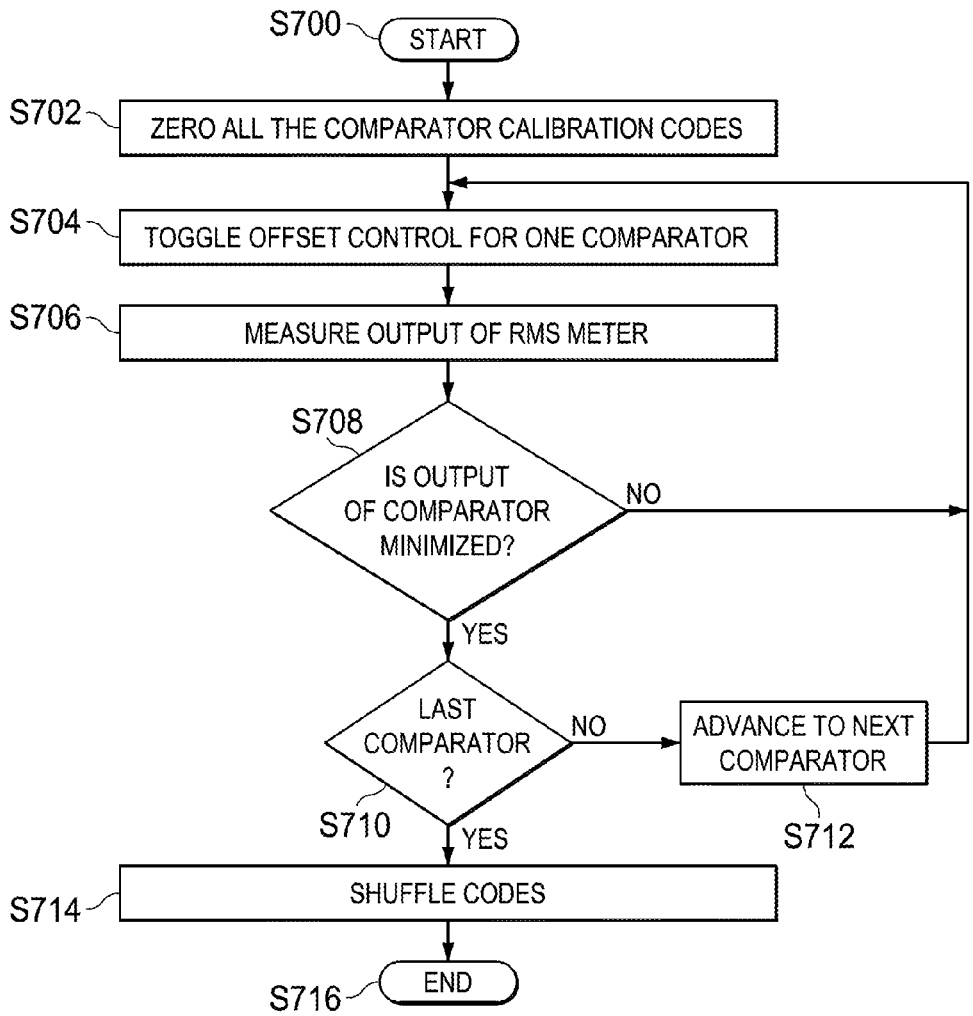
FIG. 6 is a simplified flow diagram illustrating potential operations associated with one embodiment of the present disclosure.

FIG. 6 is a simplified flow diagram illustrating potential operations associated with one embodiment of the present disclosure. The operations begin at S700 and proceed to S702 at which all of the comparator calibration codes are zeroed. At S704, the offset control for one of the 16 comparators in the flash ADC 16 is toggled. The output of the RMS meter 18 is measured at S706 by instructing the RMS meter to sample. The calibration logic 20 determines at S708 whether the output of the comparator is minimized. For example, the calibration logic makes this determination with respect to the lower left corner of the graph illustrated in FIG. 4. If the output is not minimized, the process returns to S704. On the other hand, if the output is minimized, the process proceeds to S710. Thus, the calibration logic 20 determines the calibration code that gives the lowest ADC noise.

At S710, the calibration logic 20 determines whether the output of the last of the 16 comparators has been minimized. If the last of the comparators has not yet been minimized, then the calibration logic 20 advances to the next comparator at S712 and then returns to S704. If the output of the last of the comparators has been minimized, then the calibration logic 20 shuffles the calibration codes at S714. Subsequently, the process ends at S716.

The calibration algorithm can be iterated multiple times by using the previous iteration's calibration codes as the initial condition for the current iteration. However, once the first comparator offset has been determined, a correlation problem exists with regard to the offsets of the other comparators. In particular, a multidimensional optimization problem arises. Accordingly, the codes are shuffled at S714 to avoid a local trap. The calibration logic leverages various algorithms including a random walk algorithm, a simulated annealing algorithm, and a genetic algorithm to overcome optimization traps that occur due to a non-ideal randomness of a flash shuffling action. Of course, other algorithms, such as a tabu algorithm, are also possible.

In one example of a random walk algorithm, the calibration logic randomly increments or decrements the comparator offset periodically over time.

The simulated annealing algorithm is a probabilistic approach to finding a global minimum of the noise corresponding to the offset of the comparator. In one example, the simulated annealing algorithm considers states neighboring the initial comparator offset and probabilistically chooses to either stay with the current offset or transition to a neighboring offset. The term "neighboring" in this context does not require the offset be an offset immediately adjacent to a previous one. In some iterations of the simulated annealing algorithm, suboptimal solutions are considered acceptable to avoid local optimization traps.

In an example of a genetic algorithm, the noise levels corresponding to multiple initial comparator offsets are determined. In a given iteration, a plurality of optimal offsets are selected as candidates for the next iteration, along with modified versions of those optimal offsets. The algorithm continues until a sufficiently optimal offset is determined or until a given number of iterations has been completed.

To summarize, static and dynamic offsets in ADCs are calibrated with the ADC in the same configuration as when it is operational (in-situ). The method observes quantization noise of the ADC and uses an algorithm to adjust calibration codes until the quantization noise is optimized, e.g., minimized.

In at least one aspect, certain embodiments of the present disclosure can be different from past practices because the offsets are calibrated in-situ instead of taking the blocks out of operation. Offsets due to dynamic effects and component loading, which only exist when the blocks are in normal operation, are also calibrated in this disclosure.

The disclosed technique is discussed in the context of calibrating flash comparator offsets in a ΔΣ ADC with a flash reference shuffler. The calibration logic 20 can also be programmed to adjust, in addition to the offsets, timing and gain errors of the internal multi-bit ADC 16.

One implementation estimates the flash offsets by observing an ADC's output histogram and inferring a set of offsets that match the code frequency of the histogram. Once the offsets are known, calibration codes can be generated so that the standard deviation of the post-calibrated offsets is minimized. For accurate offset estimation, any present reference shuffler should be turned off in this implementation, and a signal with a known ideal histogram should be applied to the ADC's input. Although this implementation is an in-situ calibration, a known non-static training signal should be provided. Since this implementation only estimates the offsets, the post-calibrated ADC performance may not improve as much as desired.

An alternative is to observe the ADC's output histogram and find the calibration codes that adjust the shape of the histogram to as close to ideal as possible. This approach calibrates the flash in-situ, can be done with the reference shuffler enabled, and does not require a non-static input. In this approach, adjusting the calibration code of a single comparator will affect multiple bins in the histogram. Hence, a complex algorithm would be required to optimize the calibration codes in a reasonable calibration time, if it is possible at all.

A shuffler is not necessary but it will simplify the design, as a non-static training signal should be applied otherwise. The statistics of such a training signal are known a priori and cause most of the states of the internal ADC 16 to experience transitions over time. In one implementation, the training signal is a sinusoidal waveform with large power relative to the $\Delta\Sigma$ ADC full-scale. In another implementation, the training signal is random noise with large power relative to the $\Delta\Sigma$ ADC full-scale. In one embodiment, the analog input to the internal ADC is dithered.

The present disclosure, while discussed in conjunction with the example architecture, is explicitly not so limited. Its teachings are readily applicable to a myriad of converters, frameworks, circuitry, etc. Additionally, in the discussions of the embodiments above, the ADCs, the DACs, meters, filters, power sources, amplifiers, gates, resistors, and capacitors can readily be replaced, substituted, or otherwise modified to accommodate particular circuitry needs. The use of complementary electronic devices, hardware, software, etc. offers an equally viable option for implementing the teachings of the present disclosure.

In one example embodiment, any number of electrical circuits of the FIGURES may be implemented on a motherboard of an associated electronic device. The motherboard can be a general circuit board that can hold various components of the internal electronic system of the electronic device and, further, provide connectors for other peripherals. More specifically, the motherboard can provide the electrical connections by which the other components of the system can communicate electrically. Any suitable processors (inclusive of digital signal processors, microprocessors, supporting chipsets, etc.), memory elements, etc. can be suitably coupled to the motherboard based on particular configuration needs, processing demands, computer designs, etc. Other components such as external storage, sensors, controllers for audio/video display, and peripheral devices may be attached to the motherboard as plug-in cards, via cables, or integrated into the motherboard itself.

In exemplary implementations, the calibration logic is implemented by logic encoded in one or more tangible media (e.g., embedded logic provided in an application specific integrated circuit [ASIC], a Programmable Array Logic [PAL], a Generic Array Logic [GAL]). The logic can alternatively be encoded in one or more intangible media (e.g., digital signal processor [DSP] instructions, software [potentially inclusive of object code and source code] to be executed by a processor or any other similar machine, a signal, a propagating wave, etc.).

A memory element can store software, logic, code, or processor instructions that are executed to carry out the calibration activities described in this disclosure. An example of such a memory element is a compact disc ROM (CD-ROM), a digital versatile disc ROM (DVD-ROM), or a Blu-ray Disc (BD). The memory elements can also store installation software that installs both the software that actually performs the operations, as well as associated drivers.

In another instance, operations of this disclosure are performed by a processor executing software downloaded from a server. In such an instance, the server can store the software in the same form executed by the processor. In another instance, the server stores an executable file that installs the software and associated drivers, as discussed above with regard to the memory elements. Further, such software or executable file can be spread across multiple servers.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

All of the specifications, dimensions, and relationships outlined herein (e.g., the number of processors and memory elements, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

With the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

In this disclosure, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. section 112(f) as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A calibration system for an analog-to-digital converter (ADC), comprising:
   a noise source;
   an internal ADC that receives an analog input from the noise source and converts the analog input to digital multi-bit data;
   a reference shuffling circuit that shuffles reference values of comparators of the internal ADC;
   a calibration circuit that calibrates the comparators of the internal ADC;
   a digital block that measures an amplitude based on the digital multi-bit data; and
   calibration logic configured to control the calibration circuit based on an output of the digital block.

2. The calibration system of claim 1, wherein a reference shuffling scheme is implemented in schemes that ensure that one or more of the comparators experience transitions over time, and the schemes include one of a data weighted average (DWA) scheme, a leap-frogging scheme, and a swapping scheme.

3. The calibration system of claim 1, wherein the calibration circuit adjusts offsets of the comparators of the internal ADC.

4. The calibration system of claim 1, wherein the digital block is implemented in conjunction with a power meter that estimates an output power by one of calculating a sum-of-absolute and calculating a sum-of-squares.

5. The calibration system of claim 1, wherein the calibration logic is implemented on an embedded programmable microprocessor.

6. The calibration system of claim 1, wherein the calibration logic is implemented as an on-chip architecture involving custom logic.

7. The calibration system of claim 1, wherein the calibration logic is implemented with one of a random walk algorithm, a simulated annealing algorithm, and a genetic algorithm.

8. A calibration method for an analog-to-digital converter (ADC), the method comprising:
   receiving, at an internal ADC, an analog input from a noise source;
   converting the analog input to digital multi-bit data, with the internal ADC;
   shuffling reference values of comparators of the internal ADC;
   measuring an amplitude based on the digital multi-bit data; and
   calibrating, with calibration logic, the comparators of the internal ADC, based on the amplitude.

9. The calibration method of claim 8, wherein a reference shuffling scheme is implemented in schemes that ensure that one or more of the comparators experience transitions over time, and the schemes include one of a data weighted average (DWA) scheme, a leap-frogging scheme, and a swapping scheme.

10. The calibration method of claim 8, wherein the calibrating adjusts offsets of the comparators of the internal ADC.

11. The calibration method of claim 8, wherein the measuring is implemented in conjunction with a power meter that estimates an output power by one of calculating a sum-of-absolute and calculating a sum-of-squares.

12. The calibration method of claim 8, wherein the calibration logic is implemented on an embedded programmable microprocessor or as an on-chip architecture involving custom logic.

13. The calibration method of claim 8, wherein the calibration logic is implemented with one of a random walk algorithm, a simulated annealing algorithm, and a genetic algorithm.

14. Logic encoded in one or more tangible media that includes code for execution and when executed by a processor operable to perform operations comprising:
   calibrating comparators of an ADC, based on an amplitude measured based on digital multi-bit data, wherein reference values of the comparators of the internal ADC are shuffled.

15. The logic of claim 14, wherein the calibrating adjusts offsets of the comparators of the ADC.

16. The logic of claim 14, wherein the processor is implemented as an embedded programmable microprocessor or as an on-chip architecture involving custom logic.

17. The logic of claim 14, wherein the calibrating is implemented with one of a random walk algorithm, a simulated annealing algorithm, and a genetic algorithm.

18. A calibration system for an analog-to-digital converter (ADC), comprising:
   a noise source;
   an internal ADC that receives an analog input from the noise source and converts the analog input to digital multi-bit data, wherein the internal ADC also receives a training signal where the statistics of the signal are known a priori and cause states of the internal ADC to experience transitions over time;
   a digital block that measures an amplitude based on the digital multi-bit data; and
   calibration logic configured to control a calibration circuit of the internal ADC, based on an output of the digital block.

19. The calibration system of claim 18, wherein the training signal is a sinusoidal waveform with large power relative to the $\Delta\Sigma$ ADC full-scale.

20. The calibration system of claim 18, wherein the training signal is random noise with large power relative to the $\Delta\Sigma$ ADC full-scale.

* * * * *